United States Patent [19]
Yabe

[11] Patent Number: 6,046,956
[45] Date of Patent: Apr. 4, 2000

[54] SEMICONDUCTOR DEVICE, WORD LINE DRIVER CIRCUIT AND WORD LINE DRIVING METHOD

[75] Inventor: Tomoaki Yabe, Fujisawa, Japan

[73] Assignee: Kabushiki Kaisha Toshiba, Kawasaki, Japan

[21] Appl. No.: 09/027,674

[22] Filed: Feb. 23, 1998

[30] Foreign Application Priority Data

Feb. 25, 1997 [JP] Japan .................................. 9-040684

[51] Int. Cl.[7] .................................................. G11C 8/00
[52] U.S. Cl. .............................. 365/230.06; 365/189.09; 365/194
[58] Field of Search ......................... 365/230.06, 189.11, 365/204, 189.09

[56] References Cited

U.S. PATENT DOCUMENTS

| | | | |
|---|---|---|---|
| 5,202,855 | 4/1993 | Morton | 365/226 |
| 5,351,217 | 9/1994 | Jeon | 365/230.06 |
| 5,412,331 | 5/1995 | Jun et al. | 326/105 |
| 5,557,580 | 9/1996 | Numaga et al. | 365/230.06 |
| 5,751,643 | 5/1998 | Lines | 365/189.11 |
| 5,870,348 | 2/1999 | Tomishima et al. | 365/230.06 |

OTHER PUBLICATIONS

T. Tsuruda et al, "High–speed/High–band Width Design Methodologies for on Chip DRAM Core Multimedia System LSIs," in CICC Dig. Tech. Papers. May 1996, pp 265–268.

Primary Examiner—David Nelms
Assistant Examiner—Hien Nguyen
Attorney, Agent, or Firm—Banner & Witcoff, Ltd.

[57] ABSTRACT

A semiconductor memory device comprises a memory cell array having a plurality of memory cells arranged in a row/column array, a plurality of word lines for selecting any row in the memory cell array, and a word line driver circuit for selectively activating/deactivating the word lines. The word line driver circuit has a first discharge circuit for discharging a charge on any word line to a first reference potential at a first stage for deactivating any word line and a second discharge circuit for discharging the word line which is discharged to the first reference potential to a second reference potential at a second stage which is lower than the first reference potential. In accordance with this circuit arrangement, a charge on the word line is not discharged all at one time and can be discharged stepwise. Therefore, only a smaller current drive capability is required than when the charge on the word line is discharged to the second reference potential all at one time.

27 Claims, 9 Drawing Sheets

SEMICONDUCTOR DEVICE, WORD LINE DRIVER CIRCUIT AND WORD LINE DRIVING METHOD

BACKGROUND OF THE INVENTION

The present invention relates to a semiconductor memory device and, in particular, a word line driver circuit and word line driving method for a DRAM, that is, a generally called WL boostless DRAM, not boosting word lines.

Figure 1:
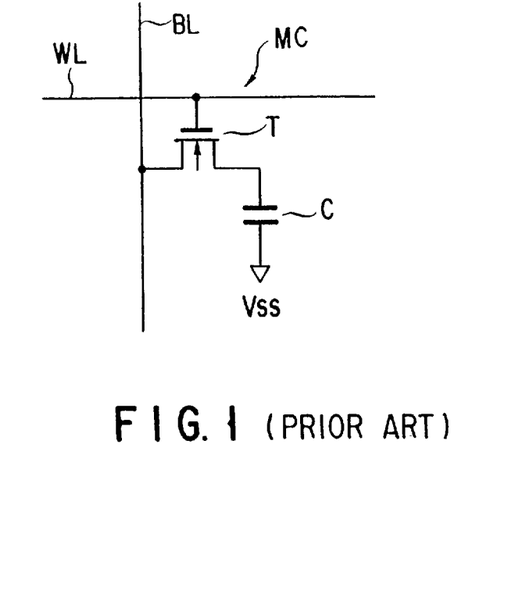
FIG. 1 is a circuit diagram showing a memory cell of a conventional DRAM.

FIG. 1 is a circuit diagram showing a memory cell of a typical DRAM. As well known in the art, in the DRAM, one memory cell MC comprises one transfer gate T (NMOS transistor) for data transfer and one capacitor C for data holding. The capacitor C is connected through the transfer gate T to a bit line BL and grounded to Vss. A word line WL is connected to the gate of the transfer gate T.

Let it be assumed that "1" data is written to the memory cell MC, that is, from the bit line BL through the transfer gate T in the memory cell MC. With a selected word line WL pulled up, a corresponding transfer gate T is turned ON. As a result, the capacitor C is charged from the bit line BL through the turned-ON transfer gate T. At this time, a potential written in the capacitor C is lowered by a threshold voltage of the transfer gate T (NMOS transistor) to prevent a fall in a write margin. It is, therefore, usual to drive the transfer gate T at about 1.5 times larger than the power supply potential (Vss). Since a voltage higher than the power supply potential Vcc is applied to the gate oxide film of the transfer gate T, the gate oxide film is thickened so as to secure reliability.

In recent years, a logic-combined DRAM has begun to be used where a logic circuit, together with a DRAM, is mounted on one chip. The logic-combined DRAM has the following problem. In order to implement the manufacturing process efficiently, the logic circuit section and DRAM section are manufactured in the same step. The gate oxide film of a transistor in the logic circuit section is so formed as to have the same thickness as the gate oxide film of the transfer gate T of the DRAM. For this reason, the transistor of the logic circuit section involves a fall in a current drive capability and the operation speed is slowed down. If the logic circuit section is formed in a different manufacturing process from that of the DRAM section, such a problem is not involved, but the manufacturing cost greatly increases due to an increase in the number of steps involved.

Figure 2:
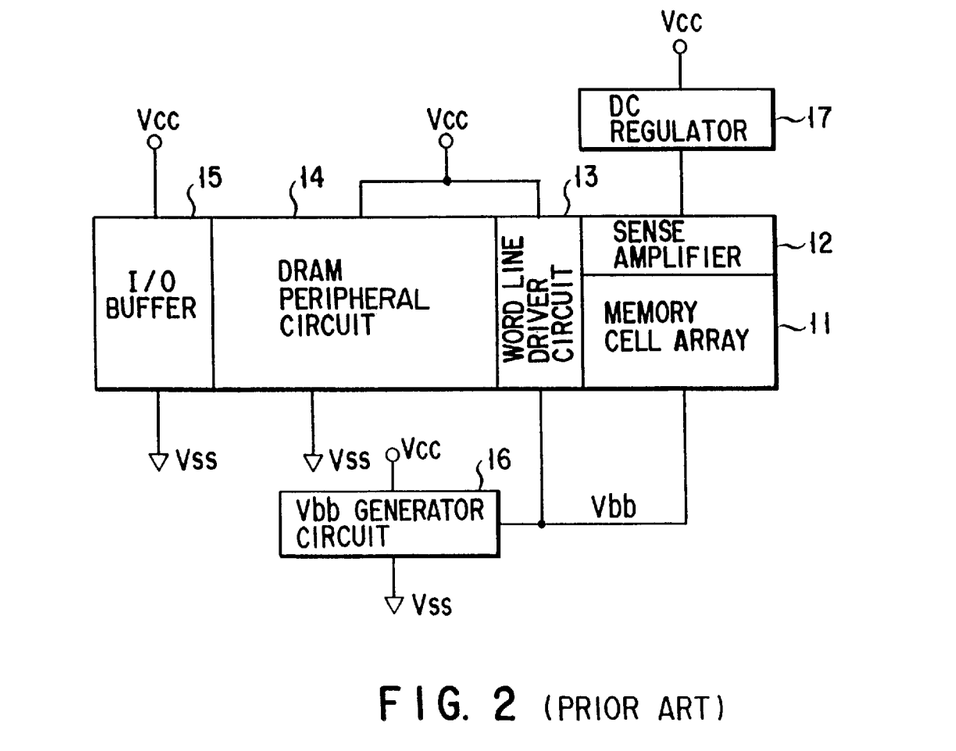
FIG. 2 is a schematic view showing a conventional WL boostless type of DRAM.

In order to solve such problem, a DRAM (hereinafter referred to as a WL boostless type DRAM) has been proposed. FIG. 2 is a circuit diagram diagrammatically showing a power supply system of a WL boostless type DRAM. This circuit comprises a memory cell amplifier 11, sense array 12, word line driver circuit 13, DRAM peripheral circuit 14, I/O buffer 15, negative potential Vbb generation circuit (Vbb generator circuit) 16, DC regulator 17, etc. The memory cell array 11 and sense amplifier 12 are operated by the output potentials of the DC regulator 17 and Vbb generator 16. The word line driver circuit 13 is operated by the output potential Vbb of the power supply potential Vcc and. The DRAM peripheral circuit 14, I/O buffer 15 and Vbb generator circuit 16 are operated across the supply potentials Vcc and Vss.

Figure 3:
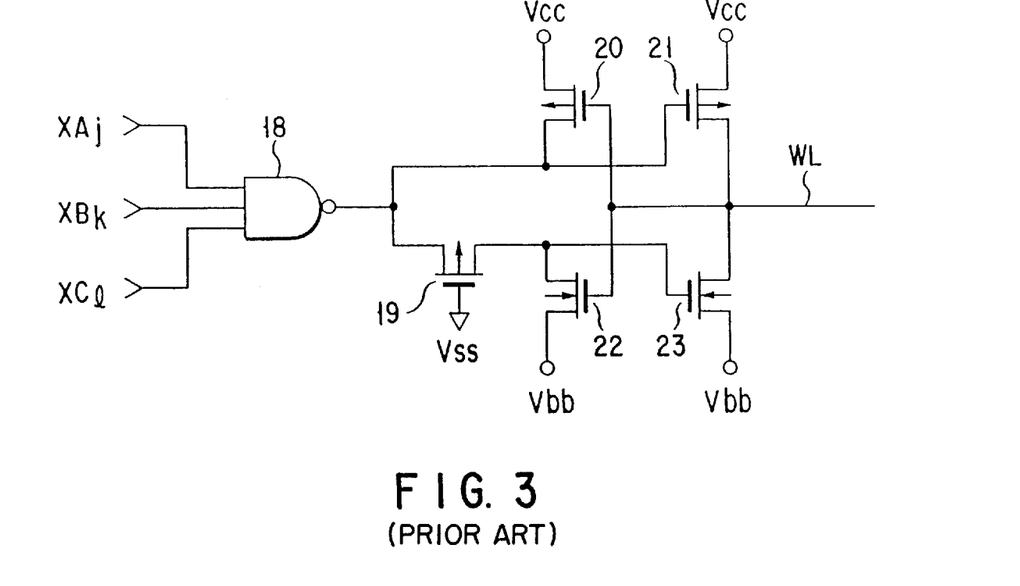
FIG. 3 is a circuit diagram showing a conventional word line driver circuit.

FIG. 3 is a circuit diagram showing a word line driver circuit 13 in FIG. 2. It is to be noted, however, that FIG. 3 shows a circuit corresponding to one word line. The word line driver circuit 13 comprises a three-input NAND type gate 18, PMOS transistors 19, 20 and 21 and NMOS transistors 22 and 23. Address signals XAj, XBk and XCl are supplied respectively to the input terminals of the NAND gate 18. The output terminal of the NAND gate 18 is connected to the source of the transistor 19, drain of the transistor 20 and gate of the transistor 21. The drain of the transistor 19 is connected to the drain of the transistor 22 and the gate of the transistor 23 and the gate of the transistor 19 is connected to ground Vss.

The transistor 20 has its source connected to the power supply potential Vcc and its gate connected to the word line WL. The source and drain of the transistor 21 are connected, respectively, to the power supply Vcc and word line WL. Further, the source of the transistor 22 is connected to the output terminal of the Vbb generator 16 and the gate of the transistor 22 is connected to the word line WL. The source of the transistor 23 is connected to the output terminal of the Vbb generator 16 and the drain of the transistor 23 is connected to the word line WL.

In the WL boostless type DRAM as shown in FIGS. 2 and 3, the transfer gate T is driven, at an address selected time, by the power supply Vcc not boosted. And at the address not-selected time the word line WL is biased to the negative potential Vbb by the word line driver circuit 13.

That is, the word line driver circuit 13 and DRAM peripheral circuit 14 are supplied with the same power supply potential Vcc. As shown in FIG. 3, when the word line WL is selected, if the transistor 21 is turned ON, the word line WL is brought up to the power supply potential Vcc. Unless the word line WL is boosted in this way, the write margin of "1" data becomes insufficient and, in the WL boostless type DRAM, the threshold voltage of the transfer gate T is set somewhat to a lower level.

If the threshold voltage of the transfer gate T is set somewhat to a lower level, more leak current flows, at the not-select time of the word line WL, from the capacitor C through the transfer gate T into the bit line BL. This causes the degeneration of the cell's pause characteristic (charge retaining characteristic).

At the not-select time, the word line WL is brought down to a lower negative potential Vbb (for example, −1 V) than the supply potential Vss. By doing so, the leak current of the transfer gate T can be reduced.

At the not-select time of the word line, however, a larger amount of discharge current flows from the word line WL into the Vbb generator 16. The Vbb generator 16, generating the potential Vbb, is required to be of a greater current supply capability type so as to drive a larger amount of discharge current. It is, therefore, unavoidable that the Vbb generator 16 be made a wider chip area. The Vbb generator 16 of such a wider chip area involves an increase in chip size, increase in dissipation power at a standby time and increase in manufacturing cost.

Such a conventional semiconductor memory device being such that the logic circuit and DRAM are integrated on one chip, if the gate oxide film of the transfer gate is so thickened as to secure the reliability of the DRAM section, then the gate oxide film of the transistor of the logic circuit section becomes also thickened because it is formed in the same process as the gate oxide film of the transfer gate T of the DRAM. In this case, the current drive capability of the transistor of the logic circuit section is lowered and an operation speed is more slowed down than when a logic LSI of the same generation is formed in its manufacturing process.

If any DRAM of such a type as not to boost the word line is adopted so as to solve the problem above, it is necessary to provide a Vbb generator of high current drive capability having a wider chip area. As a result, it involves an increase in the chip size, increase in dissipation power at a standby time and rise in manufacturing cost.

BRIEF SUMMARY OF THE INVENTION

It is accordingly the object of the present invention to provide a semiconductor memory device, word line driver circuit and word line driving method which, while adopting a word line boostless system, can prevent an increase in chip size and lower a dissipation power involved at a standby time.

In a semiconductor memory device of the present invention, any word line is so constructed as to be discharged stepwise, not discharged at one time. Therefore, a smaller current drive capability is required than when a charge on the word line is discharged all at a time, and it is possible to prevent an increase in chip size and to lower the dissipation power at a standby time.

By controlling the operation of a second discharge circuit by a controlling means it is possible to enhance the timing reliability of switching from the discharging of the word line to a first reference potential to the discharging of the word line to a second reference potential.

By forming the second discharge circuit by a MOS transistor formed in a well area to which the second reference potential is applied, it is possible to reduce the number of elements in the second discharge circuit.

In the semiconductor memory device according to the present invention, at a time of deactivating the word line, the word line is discharged to a lower level side of a supply potential through a first discharge path and, thereafter, it is discharged to a negative voltage level through a second discharge path. It is, therefore, not necessary to provide any greater current drive capability to a negative voltage generation circuit.

Further, the semiconductor memory device of the present invention is so constructed that, at a time of deactivating the word line, the word line is discharged to a first reference potential by a first discharge means and, thereafter, to a second reference potential, by a second discharge means, which is lower than the first reference potential. It is, therefore, not necessary to provide any greater current drive capability to a circuit for generating the second reference potential.

The negative potential can be easily generated from a supply voltage through a ring oscillator and charging pump circuit.

The word line driver circuit according to the present invention is so constructed as to enable the word line to be discharged through a current path of a second MOS transistor and, thereafter, the word line to be discharged through a current path of a fourth MOS transistor. It is, therefore, not necessary to provide any greater current drive capability to a circuit for generating a second potential. It is, therefore, possible to reduce the chip size, reduce the dissipation power at a standby time and reduce the cost of manufacturing.

By providing the level conversion circuit it is possible to prevent any leak current from flowing through a current path of the second MOS transistor when the word line is biased to a second potential.

The level conversion circuit can be formed by sixth through ninth MOS transistors.

Further, the word line driver circuit according to the present invention is so constructed as to enable the word line to be discharged through a current path of a third MOS transistor and, thereafter, enable the word line to be discharged through a current path of a fifth MOS transistor. Since it is not necessary to provide any greater current drive capability to the circuit for generating the second potential, it is possible to reduce the chip size, reduce the dissipation power at a standby time and reduce a manufacturing cost involved. Further, the second MOS transistor is turned OFF when the word line is biased to a second potential, so that it is possible to prevent leak current from flowing through the current path of the third MOS transistor from the word line.

Further, the word line driving method of the present invention comprises discharging a charge on the word line to a first reference potential, at a second step, at a time of deactivating the word line and, thereafter, to a second reference potential at a third step which is lower than the first reference potential. In this way, the charge on the word line is discharged stepwise, so that only a smaller current drive capability is required than when a charge on the word line is discharged to the second reference potential all at one time. It is, therefore, possible to prevent an increase in chip size and to lower the dissipation power at a standby time.

Further, the word line drive method of the present invention comprises discharging a word line to a first reference potential, at a fifth step, at a time of deactivating the word line and discharging it, at a sixth step, to a second reference potential lower than the first reference potential. In this way, the charge on the word line is charged stepwise and the circuit for generating the second reference potential has only to be operated simply at a sixth step, so that it is not necessary to provide a greater current drive capability. It is possible to reduce the chip size, reduce the dissipation power at a standby time and reduce the manufacturing cost also.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

With reference to the drawing, embodiments of the present invention will be explained in more detail below.

Figure 4:
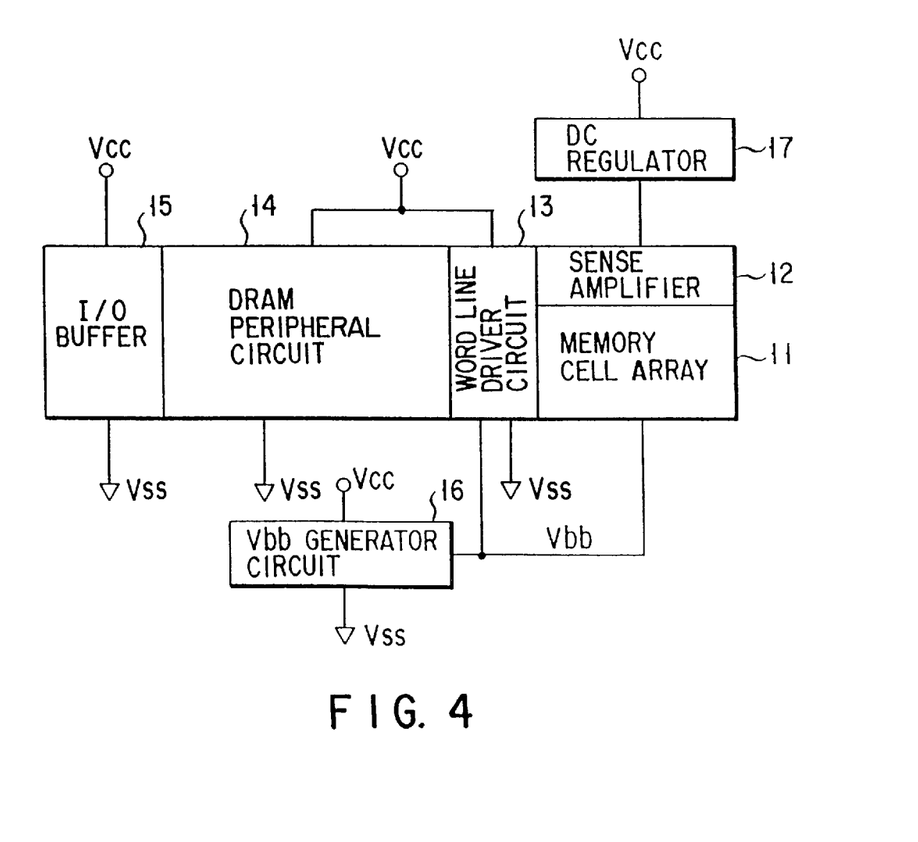
FIG. 4 is a schematic view showing a semiconductor memory device according to a first embodiment of the present invention.
Figure 5:
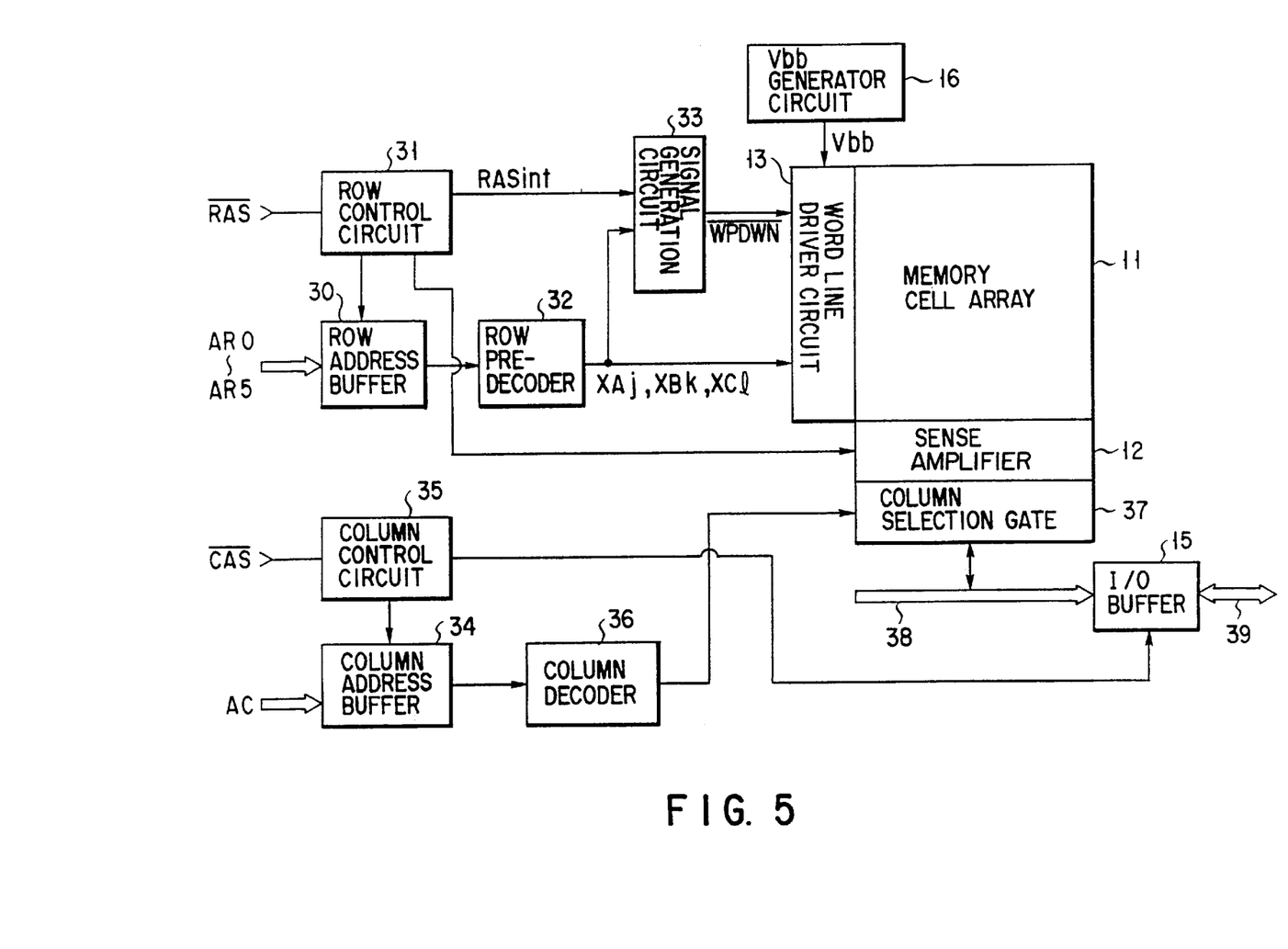
FIG. 5 is a schematic view showing a peripheral circuit of FIG. 4.

FIG. 4 is a diagrammatic view showing a semiconductor memory device according to a first embodiment of the present invention. FIG. 5 is an arrangement of a peripheral circuit in FIG. 4. The semiconductor memory device comprises a memory cell array 11, sense amplifier 12, word line driver circuit 13, DRAM peripheral circuit 14, I/O buffer 15, Vbb generator circuit 16 and DC regulator circuit 17.

The memory cell array 11 and sense amplifier 12 are operated by the output potentials Vbb and Vcc of the Vbb generator circuit 16 and DC regulator 17. The word line driver circuit 13 is operated by a first supply potential Vcc, second supply potential Vss and negative potential Vbb which is output from the Vbb generator circuit 16.

The DRAM peripheral circuit 14, I/O buffer 15 and Vbb generator 16 are operated by the supply potentials Vcc and Vss. The circuit arrangement shown in FIG. 4 differs from the conventional circuit arrangement of FIG. 2 in that not only the potential Vbb but also the potential Vss is supplied to the word line circuit 13.

As shown in FIG. 5, the DRAM 14 comprises a row address buffer 30, row control circuit 31, row predecoder 32, signal generation circuit 33, column address buffer 34, column control circuit 35, column decoder 36, column selection gate 37, DQ bus 38 and external I/O bus 39.

A plurality of memory cells (dynamic type) constituting the memory cell array 11 are arranged in a row/column array. The row control circuit 31 receives a $\overline{RAS}$ signal to control the row address buffer 30. Under control of the row control circuit 31 the row address buffer 30 latches row address signals AR0 to AR5, when the $\overline{RAS}$ signal is at a low level, and supplies a latch signal to the row predecoder 32. The row predecoder 32 outputs three row predecode signals XAj (j=0, 1, 2, 3), XBk (k=0, 1, 2, 3) XCl (l=0, 1, 2, 3) to the word line driver circuit 13. In accordance with the three row predecode signals the word line driver circuit 13 selectively drives (activated) one of those word lines in the memory cell array 11.

The signal generation circuit 33 creates a word line pull-down signal $\overline{WPDWN}$ in accordance with the three row predecode signals XAj, XBk and XCl and an inverted replica (RAS int) of the $\overline{RAS}$ signal from the row control circuit 31.

The column address buffer 34 latches a column address signal AC under control of the column control circuit 35 when the CAS becomes a low level. The latched column address signal AC is sent from the column address buffer 34 to the column decoder 36. The column decoder 36 decodes the column address signal AC. The decoded signal is supplied from the column decoder 36 to the column selection gate 37.

Data read out from the memory cell array 11, after being amplified by the sense amplifier 12, is supplied to the external I/O bus 39 through the column selection gate 37, DQ bus 38 and I/O buffer 15.

Write data input to the external I/O bus 39 is supplied to the memory cell array 11 through the I/O buffer 15, DQ bus 38, column selection gate 37 and amplifier 12. The data inputting/outputting of the I/O buffer 15 is controlled in accordance with an output signal of the column control circuit 35.

Figure 6:
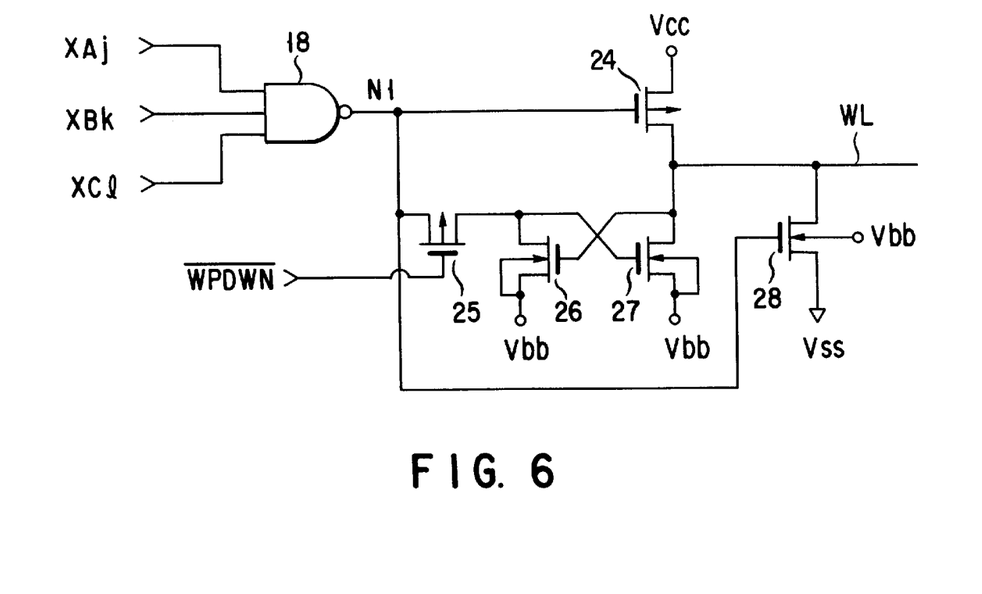
FIG. 6 is a circuit diagram showing a word line driver circuit shown in FIGS. 4 and 5.

FIG. 6 shows an arrangement of a word line driver circuit 13 in FIG. 4. Although this circuit arrangement has been explained as showing only the circuit corresponding to one word line, it is so provided in actual practice as to correspond to the number of word lines. The word line driver circuit 13 has a three-input type NAND gate 18, PMOS transistors 24, 25 and NMOS transistors 26, 27, 28. The NMOS transistors 26, 27, 28 are formed in the corresponding well area and the output potential Vbb of the Vbb generator circuit 16 is applied to the well area. The row predecode signals XAj, XBk and XCl output from the row predecoder 32 are supplied to the input terminal of the NAND gate 18.

An output terminal N1 of the NAND gate 18 is connected to the gate of the transistor 24, source of the transistor 25 and gate of the transistor 28. The source of the transistor 24 is connected to a power source Vcc and the drain of the transistor 24 is connected to a word line WL. The drain of the transistor 25 is connected to the drain of the MOS transistor 26 and gate of the MOS transistor 27 and the gate of the transistor 25 is supplied with a word line pull-down signal $\overline{WPDWN}$ which is output from the signal generation circuit 33.

The source and back gate of the MOS transistor 26 is connected to the output terminal of the Vbb generator circuit 16 and the gate of the MOS transistor 26 is connected to the word line WL. The source and back gate of the transistor 27 are connected to the output terminal of the Vbb generator circuit 16 and the drain of the transistor is connected to the word line WL. The source of the transistor 28 is connected to the power supply Vss, the drain of the transistor 28 is connected to the word line WL and the back gate of the transistor 28 is connected to the output terminal of the Vbb generator circuit 16.

The transistor 28 serves as a first pull-down (first discharge circuit) for lowering the potential of the word line WL from the Vcc level to the Vss level. The transistor 27 serves as a second pull-down (second discharge circuit) for lowering the potential of the word line WL from the Vss level to the Vbb level. In this connection it is to be noted that Vcc>Vss>Vbb and Vbb<0 volt.

Figure 7:
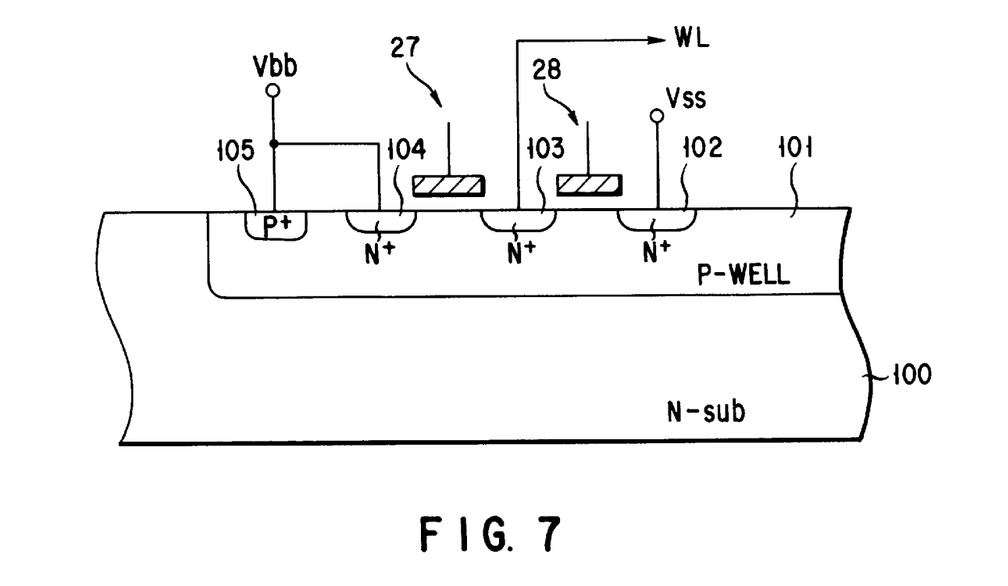
FIG. 7 is a cross-sectional view showing a pull-down transistor in FIG. 6.

FIG. 7 is a cross-sectional view showing the structures of transistors 28, 27 in FIG. 6. A P-type well 101 is formed in a surface of an N type semiconductor substrate 100. Source/drain regions 102, 103, 104 of the transistors 28 and 27 are formed in the surface portion of the P type well area 101. An output potential Vbb of the Vbb generator circuit 16 is applied to the P type well area 101 through a high concentration P type impurity diffusion area 105.

In the embodiment shown in FIG. 7, the transistors 27 and 28 share the drain region 103. The drain region 103 is connected to the word line WL. The power supply potential Vss is applied to the source region 102 of the transistor 28 and the potential Vbb is applied to the source region 104 of the transistor 27. Though being not shown in FIG. 7, the NMOS transistor 26 is formed in the surface portion of the P type well.

Figure 8:
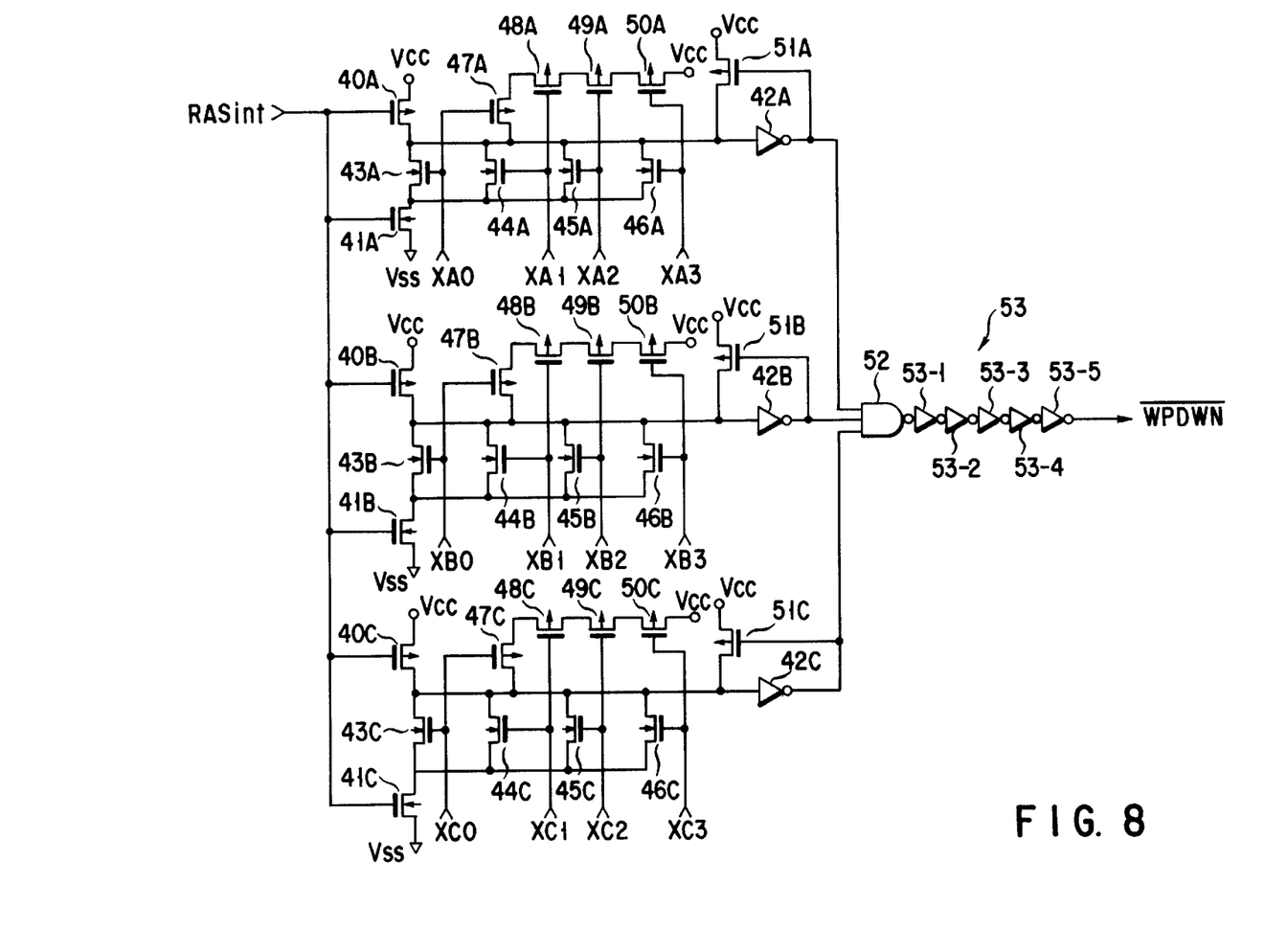
FIG. 8 is a circuit diagram showing a signal generation circuit in FIG. 5.

FIG. 8 shows an arrangement of the signal generation circuit 33 in FIG. 5. The signal generation circuit 33 has PMOS transistors 40A, 47A, 48A, 49A, 50A, 51A, 40B, 47B, 48B, 49B, 50B, 51B, 40C, 47C, 48C, 49C, 50C and 51C. Further, the signal generation circuit 33 has NMOS transistors 41A, 43A, 44A, 45A, 46A, 41B, 43B, 44B, 45B, 46B, 41C, 43C, 44C, 45C and 46C and inverters 42A, 42B and 42C. The signal generation circuit 33 includes a delay circuit 53 having a NAND gate 52 and inverters 53-1 through 53-5 in a cascade array.

The signal RAS int output from the row control circuit 31 is supplied to the gates of the transistors 40A and 41A. The source of the transistor 40A is connected to the power source Vcc and the drain of the transistor 40A is connected to the input terminal of the inverter 42A. The source of the transistor 41A is connected to the power supply Vss. The current paths of the transistors 43A, 44A, 45A and 46A are connected, in parallel array, between the drain of the transistor 41A and the drain of the transistor 40A.

Those current paths of the transistors 47A, 48A, 49A and 50A are connected, in serial array, between the input terminal of the inverter 42A and the power supply Vcc. Further, the current path of the transistor 51A is connected between the input terminal of the inverter 42A and the power supply Vcc. The output terminal of the inverter 42A is connected to the gate of the transistor 51A.

In order to control the ON/OFF of the transistors 43A and 47A by a row predecode signal XA0, the row predecode signal XA0 is supplied to the gates of the transistors 43A and 47A. In order to control the ON/OFF of the transistors 44A, 48A by a row predecode signal XA1, the row predecoder signal XA1 is supplied to the transistors 44A, 48A. In order to control the ON/OFF of the transistors 45A, 49A by a row predecode signal XA2, the row predecode signal XA2 is supplied to the gate of the transistors 45A, 49A. In order to control the ON/OFF of the transistors 46A, 50A by a row predecode signal XA3, the row predecode signal XA3 is supplied to the gates of the transistors 46A, 50A.

The signal RAS int output from the row control circuit 31 is supplied to the gates of the transistors 40B and 41B. The source of the transistor 40B is connected to the power supply Vcc and the drain of the transistor 40B is connected to the input terminal of the inverter 42B. The source of the transistor 41B is connected to the power supply Vss. Across the drain of the transistor 41B and the drain of the transistor 40B, the current paths of the transistors 43B, 44B, 45B and 46B are connected in a parallel array.

Across the input terminal of the inverter 42B and the power supply Vcc, the current paths of the transistors 47B, 48B, 49B and 50B are connected in a series array. The current path of the transistor 51B is connected between the input terminal of the inverter 42B and the power supply Vcc. The output terminal of the inverter 42B is connected to the gate of the transistor 51B. A row predecode signal XB0 is supplied to the gates of the transistors 43B and 47B, a row decode signal XB1 is supplied to the gates of the transistors 44B and 48B, a row decoder signal XB2 is supplied to the gates of the transistors 45B and 49B, and a row decode signal XB3 is supplied to the gates of the transistors 46B and 50B, these transistors 43B, 47B, 44B, 48B, 45B, 49B and 46B, 50B being controlled in an ON/OFF fashion.

Further, the signal RAS int output from the row control circuit 31 is supplied to the gates of the transistors 40C and 41C. The source of the transistor 40C is connected to the power supply Vcc and the drain of the transistor 40C is connected to the input terminal of the inverter 42C. The source of the transistor 41C is connected to the power supply Vss and, between the drain of the transistor 41C and the drain of transistor 40C, the current paths of the transistors 43C, 44C, 45C and 46C are connected in a parallel array. Between the input terminal of the inverter 42C and the power supply Vcc, the current paths of the transistors 47C, 48C, 49C and 50C are connected in a series array. Further, between the input terminal of the inverter 42C and the power supply Vcc the current path of the transistor 51C is connected and the output terminal of the inverter 42C is connected to the gate of the transistor 51C. A row predecode signal XC0 is supplied to the gates of the transistors 43C and 47C, a row predecode signal XC1 is supplied to the gates of the transistors 44C and 48C, a row predecode signal XC2 is supplied to the gates of the transistors 45C and 49C and a row predecode signal XC3 is supplied to the gates of the transistor 46C and 50C, these transistors 43C, 47C, 44C, 48C, 45C, 49C and 46C, 50C being controlled in an ON/OFF fashion.

The output terminals of the inverters 42A, 42B and 42C are connected to the input terminal of the NAND gate 52 and the output signal of the NAND gate 52 is output, as a word line pull-down signal $\overline{WPDWN}$, through a delay circuit 53.

Figure 9:
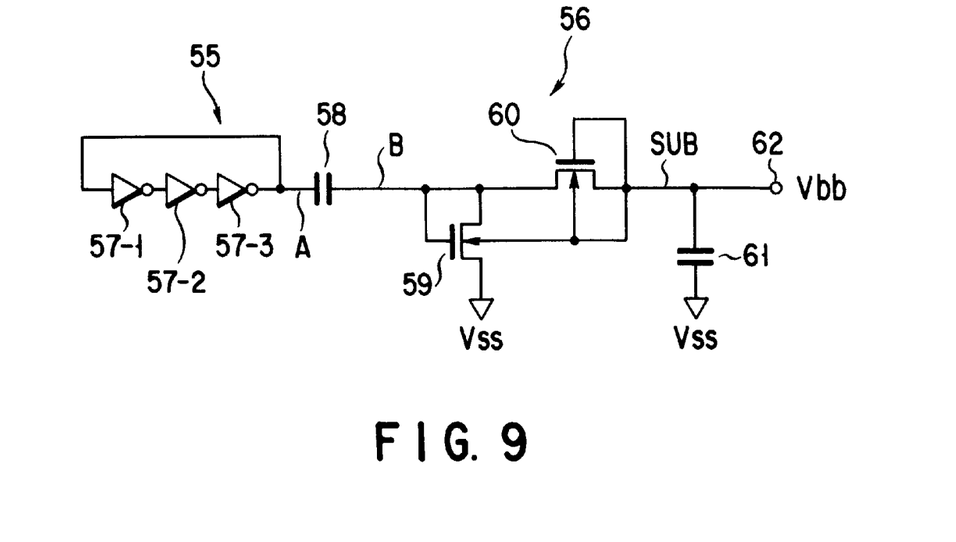
FIG. 9 is a circuit diagram showing a Vbb generation circuit of FIGS. 4 and 5.

FIG. 9 is a circuit diagram showing the Vbb generator circuit 16 in FIGS. 4 and 5. The Vbb generator circuit 16 comprises a ring oscillator 55 and charge pump circuit 56. The ring oscillator 55 has an odd number of inverters 57-1 to 57-3 connected in a ring-like manner. The charge pump circuit 56 has a capacitor 58, NMOS transistors 59, 60 and capacitor 61.

The oscillation output of the ring oscillator 55 is supplied to one electrode of the capacitor 58 and the transistor 59 of a threshold voltage Vth1 is connected at the drain and gate to the other electrode of the capacitor 58 and at the source to the power supply Vss. The second transistor 60 of a threshold voltage Vth2 is connected at the source to said other electrode of the capacitor 58 and at the drain and gate to the Vbb output terminal 62. The back gates of the transistors 59 and 60 are connected to the Vbb output terminal 62.

The capacitor 61 is connected between the Vbb output terminal 62 and the power supply Vss. By forming the transistors 59, 60 in a well area, the capacitor 61 can be formed through the utilization of a P/N junction between the well area and the semiconductor substrate.

Figure 10:
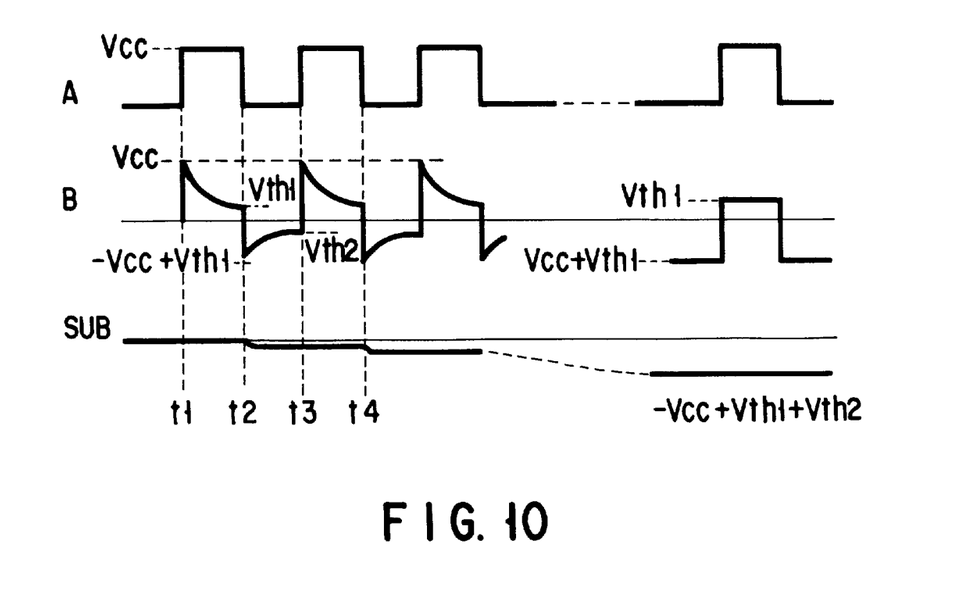
FIG. 10 shows a time variation of potentials on nodes A, B and on a substrate node in FIG. 9.

FIG. 10 shows an operation waveform diagram of the Vbb generator circuit 16 shown in FIG. 9. The substrate node SUB has an initial value of 0 V. A rectangular wave emerges at a node A (FIG. 9) by the oscillation of the ring oscillator 55. Through the coupling of the capacitor, a potential on a node B (FIG. 9) rises from a 0 V to the Vcc level in response to the rise (t1) of a potential on the node A. This causes the transistor 59 to be turned ON, so that a discharge occurs at the node B until the transistor 59 is turned OFF.

Then, when the potential on the node A is lowered to 0 V (t2), the potential on the node B is discharged to a "−Vcc+Vth1" level again through the coupling of the capacitor, so that the transistor 60 is turned ON. Therefore, the node B is pulled up to a "−Vth2" level at which the transistor 60 is turned OFF. During this process, electrons are injected into the substrate node SUB.

Through the repetition of such operation, electrons are injected little by little into the capacitor 61 at the substrate node SUB, so that the potential on the substrate node SUB is lowered to a "−Vcc+Vth1+Vth2" level.

Figure 11:
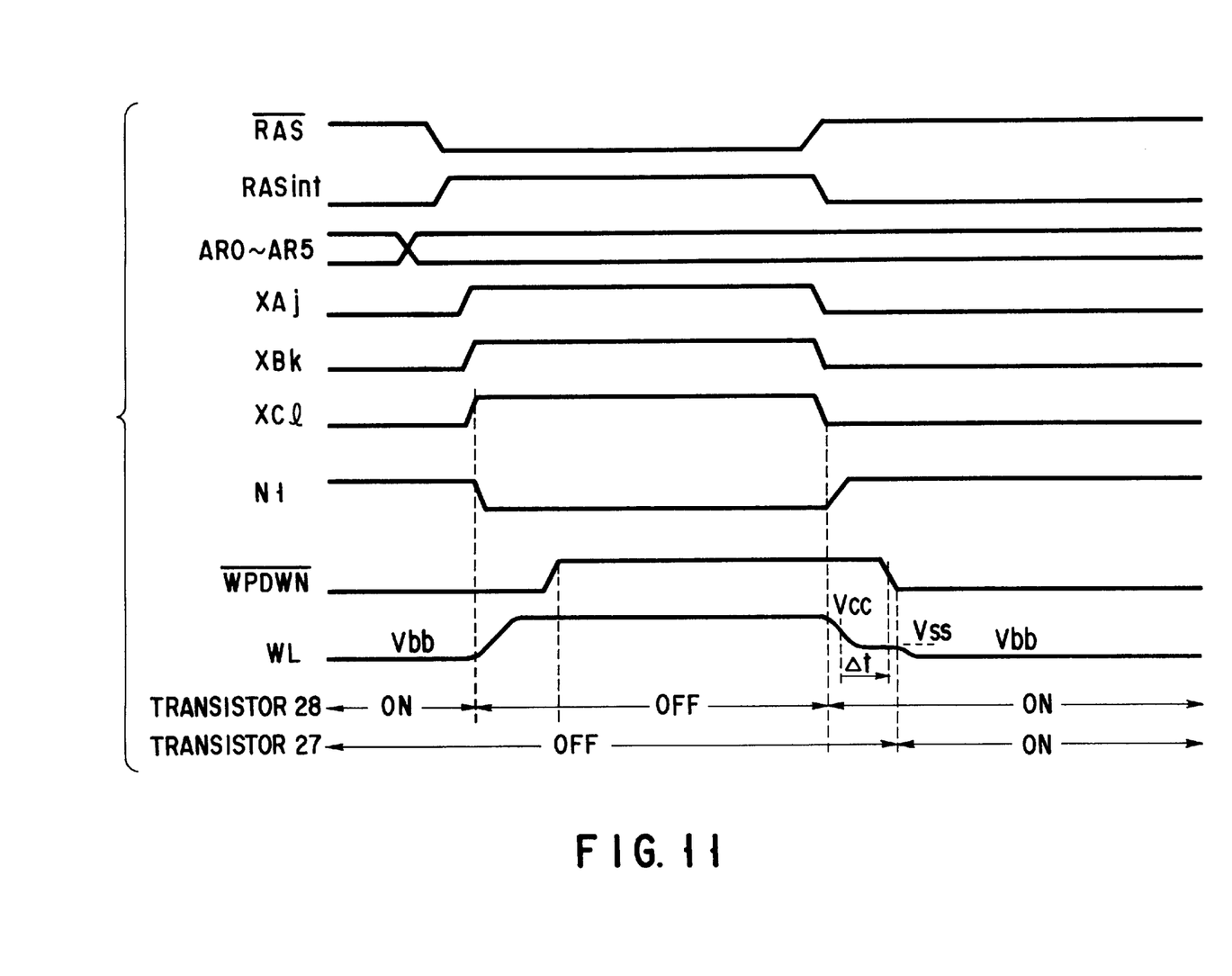
FIG. 11 is a view mainly showing a time variation of the word line's potential in the first embodiment.

Now the operation of the above-mentioned DRAM will be explained below with reference to FIG. 11. Here, explanation will be given below mainly about the access operation of the row address.

When the $\overline{\text{RAS}}$ signal falls to a low level, the row address signals AR0 to AR5 are supplied to the row address buffer 30 under control of the row control circuit 31, starting the access operation. The output signal of the row address buffer 30 is predecoded by the row predecoder 32. By doing so, those selected row predecode signals XAj, XBk, XCl are changed to high levels and they are supplied to the word line driver circuit 13 and signal generation circuit 33.

When the selected row predecode signals XAj, XBk, XCl rise to high levels, the potential on the word WL rises to a Vcc level. When a potential on the output terminal Ni of the NAND gate 18 in FIG. 6 becomes a low level and the transistor 24 is turned ON, the word line WL rises to the power supply Vcc level. When the $\overline{\text{RAS}}$ signal falls to a low level, the signal RAS mt output from the row control circuit 3 1 rises to a high level. With a rise of the signal RAS int and a rise of the row predecode signals XAj, XBk, XCl, the word line pull-down signal $\overline{\text{WPDWN}}$ rises to a high level.

Next when the $\overline{\text{RAS}}$ signal rises to a high level, a discharge cycle of the word line WL is started. When the $\overline{\text{RAS}}$ signal rises to a high level and signal RAS int falls to a low level, the row predecode signals XAj, XBk, XCl are deactivated to low levels. In the word line driver circuit 13 shown in FIG. 6, the transistor 28 for the first pull-down is activated and turned ON. Through a first discharge path provided by the current path of the transistor 28, the word line WL is discharged to the power supply level Vss.

When the signal RAS et falls to a low level, the word line pull-down signal $\overline{\text{WPDWN}}$ output from the signal generation circuit 33 in FIG. 8 falls to a lower level. At this time, through the delay circuit 53 provided in the signal generation circuit 33, a predetermined delay is produced from when the signal RAS int falls to a low level to when the signal $\overline{\text{WPDWN}}$ falls. The delay time Δt is determined depending upon the number of stages of inverters (53-1 to 53-5) in the delay circuit 53.

When the signal $\overline{\text{WPDWN}}$ falls to a low level, the gate of the transistor 27 for the second pull-down in the word line driver circuit 13 in FIG. 6 rises to a power supply Vcc level, activating the transistor 27 and turning it ON. And a potential on the word line WL falling to a power supply Vss level is further pulled down to the Vbb level through a second discharge path provided by the current path of the transistor 27.

According to the circuit arrangement as set out above, the word line WL is discharged by the first pull-down transistor 27 from the Vcc level to the power supply potential level Vss and, subsequently, by the second pull-down transistor 27 from the Vss level to the potential level Vbb (final target level).

In this way, the word line WL is discharged at a plural stage (here at two stages) through the Vbb generator circuit 16 and a smaller current drive power is required for the Vbb generator circuit 16 than in a conventional method by which the charge on the word line WL is discharged at one stage from a potential level Vbb to a potential level Vbb. It is, therefore, possible to reduce the standby current and lower the dissipation power. Further, only a smaller chip occupation area is required for the Vbb generator circuit 16, thus reducing the chip size in the semiconductor memory device as well as lowering a manufacturing cost.

With respect to the advantages of lowering the dissipation power and reducing the pattern area, a 64M byte-long DRAM with a refresh cycle of 2K will be explained below by way of example. And let it be assumed that 32 word lines are activated at a time and that the lower cycle time tRC is 90 ns and a capacitance Cwl per word line is 1.5 pF and that Vcc =25 V and Vbb=−1 V.

In the case where a charge on the word line is discharged at one step from the Vcc level to the Vbb level, a load current I load (conv.) flowing from the word line, at a low cycle time, into the Vbb generator circuit 16 is given below:

$$Iload(conv.) = (Vcc - Vbb)Cwl \times 32/tRC$$

$$= \{2.5 - (-1)\} \times (1.5E - 12) \times 32/(90E - 9)$$

$$= 1.86 \text{ mA.}$$

In the case where a discharge is made from the Vss level to Vbb level, a load current Iload (new) flowing from the word line, at a low cycle time, into the word line under the same condition is given below:

$$Iload(new) = (Vss - Vbb)Cwl \times 32/tRC$$

$$= 1 \times (1.5E - 12) \times 32/(90E - 9)$$

$$= 0.53 \text{ mA.}$$

Hence
Iload(new)/Iload(conv.)=0.285.
It is, therefore, possible to largely lower the dissipation power of the Vbb generator circuit 16.

The transistor size and pattern area of the Vbb generator circuit are determined substantially in proportion to the load current I load. By doing so, the pattern occupation area of the Vbb generator circuit can be reduced to about 30% of the conventional counterpart.

In the word line driver circuit shown in FIG. 6, when the word line WL is biased to the Vbb level, the source of the first pull-down transistor 28 is biased to the Vbb level and the drain and gate of the transistor are biased to the Vss level a "|Vbb|−Vss" becomes nearly equal to the threshold voltage of the transistor 28, thus offering a risk of producing a leak current. This risk can be nearly solved by setting the gate length of the first pull-down transistor 28 somewhat longer and/or setting the threshold voltage through the adjustment of ions injected into the channel region.

Figure 12:
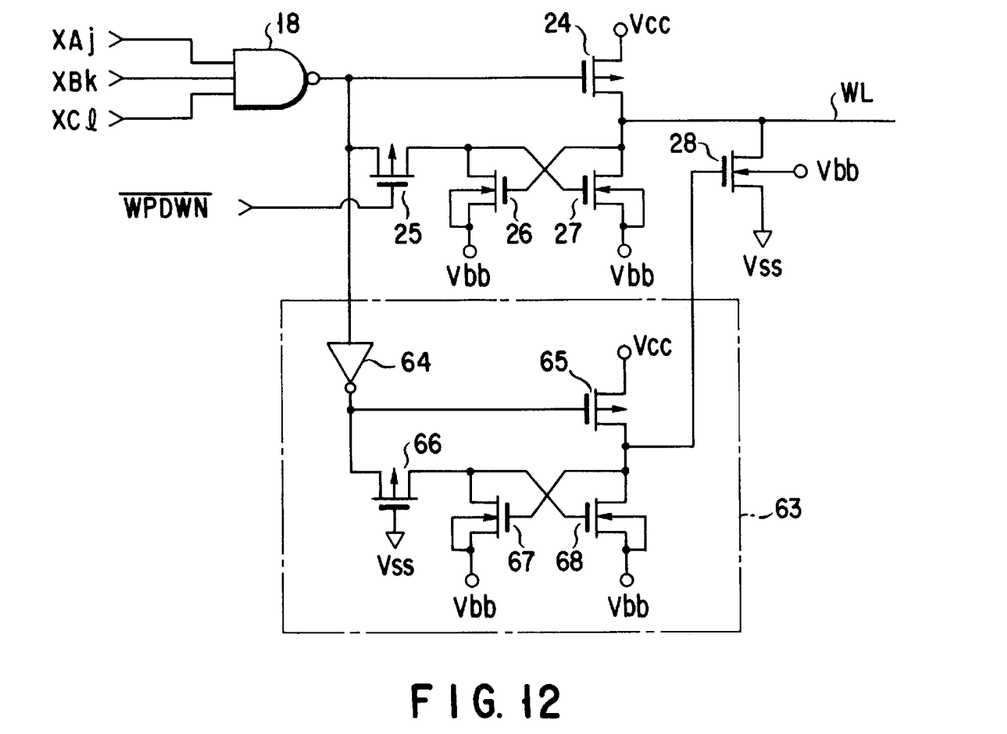
FIG. 12 is a circuit arrangement of a word line driver circuit in a second embodiment of the present invention.
Figure 13:
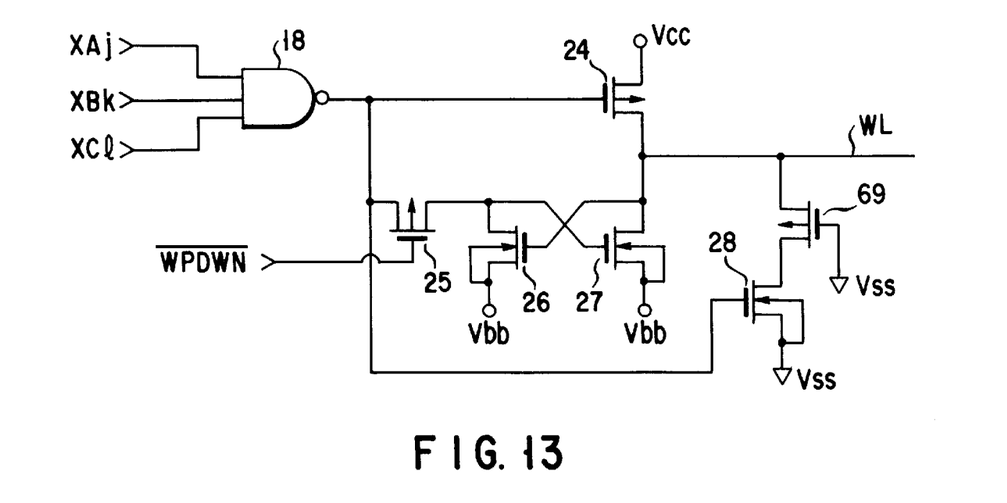
FIG. 13 is a circuit arrangement of a word line driver circuit in a third embodiment.

FIGS. 12 and 13 show the arrangements of word line driver circuits of second and third embodiments of the present invention. In the second and third embodiments, the word line driver circuit is so improved as the positively reduce to current penetrating the first pull-down transistor 28. In this connection it is to be noted that, except in th at area, the second and third embodiments are the same as the first embodiment.

In the word line driver circuit shown in FIG. 12, the output of a three-input type NAND gate 18 is supplied through a level conversion circuit 63 to the gate of a first pull-down transistor 28. The level conversion circuit 63 comprises an inverter 64, PMOS transistors 65, 66 and NMOS transistors 67, 68. The gate of the transistor 65 and source of the transistor 66 are connected to the output terminal of the inverter 64.

The source of the transistor 65 is connected to a power supply Vcc and the drain of the transistor 65 is connected to the gate of the transistor 28. The drain of the transistor 66 is connected to the drain of the transistor 67 and the gate of the transistor 68 and the gate of the transistor 66 is connected to a ground potential Vss. The source and backgate of the transistor 67 are connected to the output terminal of the Vbb generator circuit 16 and the gate of the transistor 67 is connected to the drain of the transistor 65. The source and back gate of the transistor 68 are connected to the output terminal of the Vbb generator circuit 16 and the drain of the transistor 68 is connected to the drain of the transistor 65.

In such a circuit arrangement, when the word line WL is biased to the Vbb level, the gate of the first pull-down transistor 28 is also biased to the vbb level by the level conversion circuit 63. At this time, the source of the first pull-down transistor 28 is placed, together with the word line WL, at the Vbb level, so that there is no risk that the first pull-down transistor 28 will be turned ON. It is, therefore, possible to positively cut off any leak current via a current path of the transistor 28.

In the word line driver circuit shown in FIG. 13, a PMOS transistor 69 fixed to a power supply Vss is inserted between a word line WL and the drain of the first pull-down transistor 28. When a potential on the word line WL is fixed to the Vbb level, it is also possible to cut off any penetrating current because the transistor 69 is off. In this connection it is to be noted that the third embodiment is somewhat different from the first and second embodiments with respect to a discharge waveform involved at a discharge operation of the word line.

Figure 14:
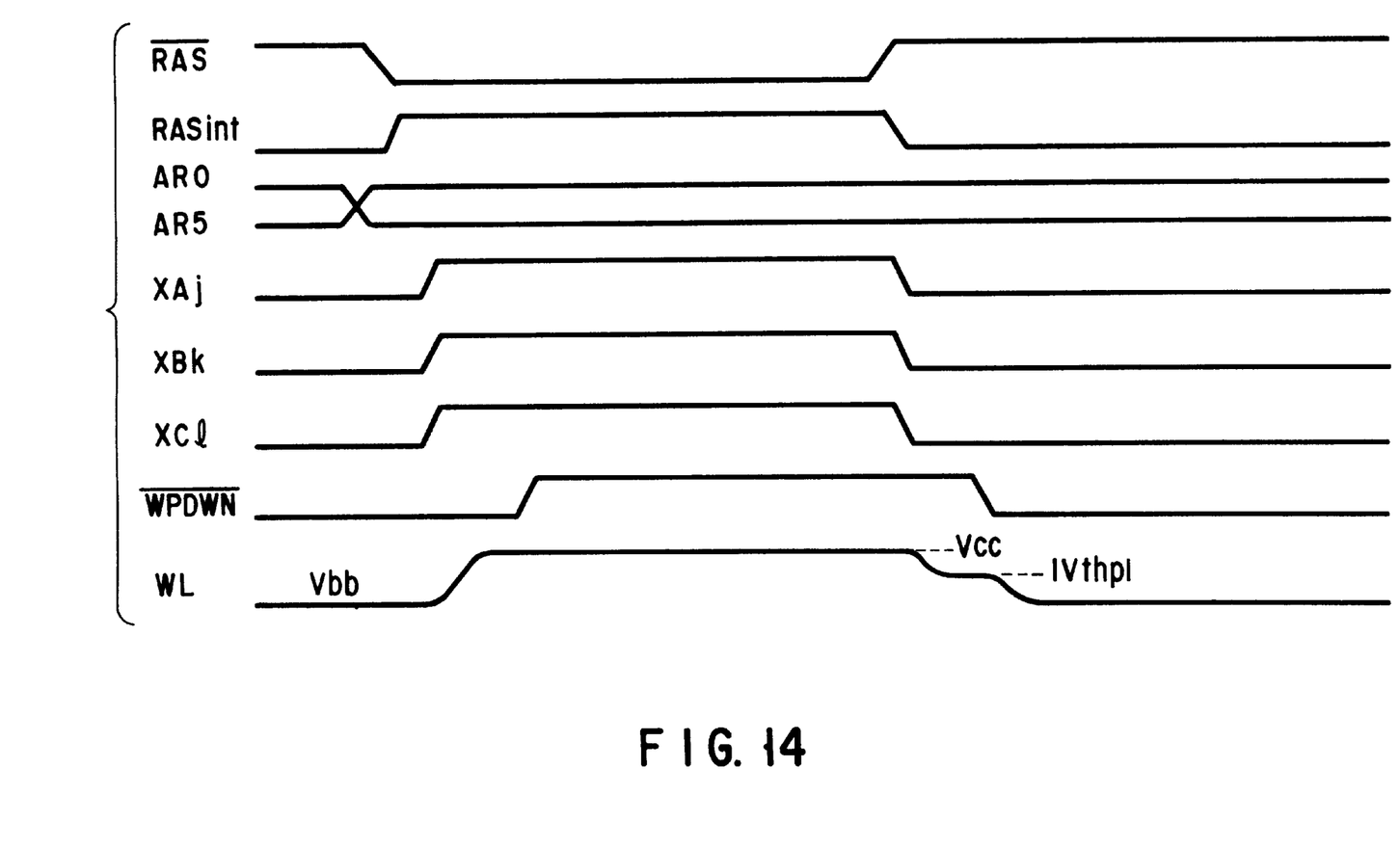
FIG. 14 is a view mainly showing a time variation in a word line's potential in the third embodiment.

FIG. 14 shows the operation waveform diagram of the third embodiment. At the discharge time of the word line WL, a charge on the word line WL is discharged to a |Vthp| level via a current path of the transistor 69 and first pull-down transistor 28. In this connection, it is to be noted that the Vthp denotes the threshold voltage of the transistor 69. Thereafter, a signal $\overline{WPDWN}$ falls to a low level and, from that level, a charge on the word line WL is discharged to a Vbb level.

Even in the third embodiment, only a relatively small current has to be flowed into the Vbb generator circuit 16 when the charge on the word line WL is discharged from the |Vthp| level to the Vbb level.

The present invention is not restricted to the above-mentioned embodiment and various changes or modifications of the invention can be made without departing from the spirit and scope of the present invention. For example, the present invention can be applied not only to the DRAM but also to be SRAM.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device comprising:
    a memory cell array having a plurality of memory cells arranged in a row/column array;
    a plurality of word lines selecting any row in the memory cell array; and
    a word line driver circuit selectively deactivating any word line in which the word line driver circuit has a first discharge circuit for discharging a charge on any word line to a first reference potential and a second discharge circuit for discharging the charge on the word line which has been discharged to the first reference potential to a second reference potential lower than the first reference level.

2. The device according to claim 1, further comprising a control circuit controlling a discharge timing of the first discharge circuit and a discharge timing of the second discharge circuit.

3. The device according to claim 1, further comprising a reference potential generating circuit generating the second reference potential from the first reference potential.

4. The device according to claim 1, wherein the second discharge circuit has a MOS transistor of a first conductivity type formed in a well area to which the second reference potential is applied.

5. The device according to claim 4, further comprising a level conversion circuit which, when the word line is biased to the second reference potential, supplies the second reference potential to a gate of the MOS transistor.

6. The device according to claim 1, wherein the first discharge circuit has a MOS transistor of a first conductivity type formed in a well area to which the second reference potential is applied and a MOS transistor of a second conductivity type connected in series with the MOS transistor of the first conductivity type and the first reference potential is applied to a gate of the second transistor of the second conductivity type and a drain of the MOS transistor of the first conductivity type is connected to a drain of the MOS transistor of the second conductivity type.

7. A semiconductor memory device comprising:
    a memory cell array having a plurality of memory cells arranged in a row/column array;
    a plurality of word lines selecting any row in the memory cell array; and
    a word line driver circuit selectively deactivating any word line, in which the word line driver circuit is provided to allow a charge on the word line to be discharged stepwise so as to deactivate the any word line.

8. A semiconductor memory device comprising:
    a memory cell array having a plurality of memory cells arranged in a row/column array;
    word lines selecting any row in the memory cell array;
    a word line driver circuit selectively activating/deactivating any word line;
    a sense amplifier amplifying data read from a memory cell;
    a DC regulator supplying a potential lower than a supply voltage to the sense amplifier;
    a negative voltage generation circuit generating a negative voltage from the supply voltage and applying the negative voltage to the memory cell array and the word line driver circuit;
    a peripheral circuit operated by the supply voltage; and
    an I/O buffer driven by the supply voltage to allow inputting/outputting of data, wherein
    the word line driver circuit has a first discharge path allowing a charge on any word line to be discharged to a low level side of the supply voltage at a deactivating time and a second discharge path allowing the word line which is discharged to the low level side of the supply voltage to be discharged to an output potential level of the negative voltage generation circuit.

9. A semiconductor memory device comprising:
    a memory cell array having a plurality of memory cells arranged in a row/column array;
    word lines selecting any row in the memory cell array;
    a word line driver circuit selectively activating the word lines;
    a sense amplifier amplifying data read out from a memory cell;

a column selection gate selecting any column in the memory cell array;

an I/O buffer supplied with an output signal of the column selection gate via a DQ bus;

a row address buffer receiving a row address signal;

a row predecoder supplied with an output signal of the row address buffer and supplying a predecode signal to the word line driver circuit;

a signal generation circuit supplied with an output signal of the row predecoder, generating a word line pull-down signal and controlling the word line driver circuit;

a row system control circuit controlling the row address buffer, the signal generation circuit and the sense amplifier in response to a row address strobe signal;

a column address buffer supplied with a column address signal;

a column decoder supplied with an output signal of the column address buffer and supplying a decode signal to the column selection gate; and a column control circuit controlling the column address buffer and the I/O buffer in response to a column address strobe signal, wherein the word line driver circuit has a first discharge circuit allowing a charge on any word line to be discharged to a first reference potential at deactivating time and a second discharge circuit allowing the word line which is discharged to the first reference potential to be discharged to a second reference potential lower than the first reference potential.

10. The device according to claim 9, further comprising a reference potential generating circuit generating the second reference potential.

11. The device according to claim 10, wherein the reference potential generating circuit has a ring oscillator and a charge pump circuit so as to generate a negative potential from a power supply voltage.

12. A word line driver circuit comprising:

a NAND gate supplied with a row predecode signal;

a first MOS transistor of a first conductivity type having a current path connected at a first end to a first potential supply and at a second end to a word line and having a gate supplied with an output signal of the NAND gate and charging the word line to a first potential;

a second MOS transistor of a second conductivity type having a current path connected at a first end to the word line and at a second end to a second potential supply and having a gate supplied with the output signal of the NAND gate and a back gate connected to a third potential supply and charging the word line to a second potential;

a third MOS transistor of a first conductivity type having a current path connected at a first end to the output signal of the NAND gate and having a gate supplied with a word line pull-down signal and adapted to be cut off when the word line is discharged;

a fourth MOS transistor of a second conductivity type having a current path connected at a first end to the word line and at a second end to the third potential supply and a back gate connected to the third potential supply and having a gate connected to a second end of the current path of the third MOS transistor and discharging the word line to a third potential lower than the second potential; and a fifth MOS transistor having a current path connected at a first end to the second end of the current path of the third MOS transistor and at the second end to the third potential supply and having a back gate connected to the third potential supply and a gate connected to the word line.

13. The circuit according to claim 12, further comprising a level conversion circuit supplying the third potential to the gate of the second MOS transistor when the word line is biased to the third potential.

14. The circuit according to claim 13, wherein the level conversion circuit converts the level of the output signal of the NAND gate to a level of the third potential supply to supply a resultant signal to the gate of the second MOS transistor.

15. The circuit according to claim 14, wherein the level conversion circuit includes:

an inverter connected at an input terminal to the output signal of the NAND gate;

a sixth MOS transistor of the first conductivity type having a current path connected at a first end to an output terminal of the inverter and a gate connected to the second potential supply;

a seventh MOS transistor of the first conductivity type having a current path connected at a first end to the first potential supply and a gate connected to the output terminal of the inverter;

an eighth MOS transistor of a second conductivity type having a current path connected at a first end to a second end of the current path of the seventh MOS transistor and to the gate of the second MOS transistor and at a second end to the third potential supply and a back gate connected to the third potential supply and a gate connected to a second end of the current path of the sixth MOS transistor; and a ninth MOS transistor of the second conductivity type having a current path connected at a first end to the second end of the current path of the sixth MOS transistor and at a second end to the third potential supply and having a back gate connected to the second end of the current path of the seventh MOS transistor.

16. A word line driver circuit comprising:

a NAND gate supplying a row predecode signal;

a first MOS transistor of a first conductivity type having a current path connected at a first end to a first potential supply and at a second end to a word line and having a gate supplied with an output signal of the NAND gate and charging the word line to a first potential;

a second MOS transistor of the first conductivity type having a current path connected at a first end to the word line and a gate connected to a second potential supply;

a third MOS transistor of a second conductivity type having a current path connected at a first end to a second end of the second MOS transistor and at a second end connected to the second potential supply and having a back gate connected to the second potential supply and a gate supplied with the output signal of the NAND gate and charging the word line, together with the second MOS transistor, to a second potential;

a fourth MOS transistor of the first conductivity type having a current path connected at a first end to the output signal of the NAND gate and having a gate supplied with a word line pull-down signal and adapted to be cut off when the word line is discharged;

a fifth MOS transistor having a current path connected at a first end to the word line and at a second end to a third potential supply and having a back gate connected to the third potential supply and a gate connected to a second end of the current path of the fourth MOS transistor and charging the word line to a third potential lower than the second potential; and a sixth MOS transistor of the second conductivity type having a current path connected at a first end to the second end of the current path of the fourth MOS transistor and at a second end to the third potential supply and having a back gate connected to the third potential supply and a gate connected to the word line.

17. A method for driving word lines, comprising the steps of:

activating any word line in a memory cell array;

discharging the activated word line to a first reference potential; and discharging the word line which is discharged to the first reference potential to a second reference potential.

18. A method for driving word lines, comprising the steps of;

activating any word line in a memory cell array; and discharging the activated word line, stepwise, to a target potential.

19. A method for driving word lines in a semiconductor memory device comprising:

a memory cell array having memory cells arranged in a row/column array;

word lines selecting any row in the memory cell array;

a word line driver circuit selectively driving a word line;

a sense amplifier amplifying data read out from a memory cell in the memory cell array;

a column selection gate selecting a column in the memory cell array;

an I/O buffer allowing an output signal of the column selection gate to be supplied via a DQ bus;

a row address buffer allowing the inputting of a row address signal;

a row predecoder receiving an output signal of the row address buffer and supplying a predecode signal to the word line driver circuit;

a signal generation circuit receiving an output signal of the row predecoder and generating a word line pull-down signal to control the word line driver circuit;

row control circuit controlling the row address buffer, the signal generation circuit and the sense amplifier in response to a row address strobe signal;

a column address buffer allowing the inputting of a column address signal;

a column decoder receiving an output signal of the column address buffer and supplying a decode signal to the column selection gate; and a column control circuit controlling the column address buffer and the I/O buffer in response to a column address strobe signal, said method comprising the steps of:

picking up the row address signal, in response to the row address strobe signal, under control of the row control circuit;

decoding the output signal of the row address buffer by the row predecoder and generating the predecode signal;

supplying the predecode signal to the word line driver circuit and charging and activating the selected word line;

receiving the row predecoder signal, generating a word line pull-down signal at the signal generation circuit on the basis of the control of the row control circuit and supplying the word line pull-down signal to the word line driver circuit;

discharging the word line by the word line driver circuit to a first reference potential at a time of deactivating the word line; and discharging the word line which is discharged to the first reference potential to a second reference potential lower than the first reference potential.

20. The method according to claim 19, further comprising the step of, when the word line is biased to the second reference potential, supplying the second reference potential to a gate of a MOS transistor in the word line driver circuit so as to discharge the word line to the second reference potential.

21. The device according to claim 1, further comprising a power voltage lowering circuit lowering a power voltage, to generate the first reference potential.

22. The device according to claim 21, wherein the second reference potential is negative.

23. The device according to claim 22, further comprising a negative potential lowering circuit generating the second reference potential from the power voltage.

24. The device according to claim 7, wherein the word line driver circuit discharges a charge on an arbitrary word line stepwise until the word line has a negative potential.

25. The device according to claim 17, wherein the first reference potential is lower than the power voltage.

26. The device according to claim 25, wherein the second reference potential is negative.

27. The device according to claim 18, wherein the target potential is negative.

* * * * *